United States Patent
Shalikashvili et al.

(10) Patent No.: US 12,255,670 B2
(45) Date of Patent: Mar. 18, 2025

(54) COMPRESSION STRATEGY SELECTION POWERED BY MACHINE LEARNING

(71) Applicant: MELLANOX TECHNOLOGIES, LTD., Yokneam (IL)

(72) Inventors: Vladimir Shalikashvili, Petah Tikva (IL); Ran Sandhaus, Tel Aviv (IL)

(73) Assignee: Mellanox Technologies, Ltd, Yokneam (IL)

(*) Notice: Subject to any disclaimer, the term of this patent is extended or adjusted under 35 U.S.C. 154(b) by 144 days.

(21) Appl. No.: 17/890,337

(22) Filed: Aug. 18, 2022

(65) Prior Publication Data
US 2024/0063814 A1    Feb. 22, 2024

(51) Int. Cl.
| | |
|---|---|
| H03M 7/30 | (2006.01) |
| G06F 3/06 | (2006.01) |
| G06F 9/50 | (2006.01) |
| G06F 12/16 | (2006.01) |

(52) U.S. Cl.
CPC ............ H03M 7/6088 (2013.01); *G06F 3/06* (2013.01); *G06F 9/50* (2013.01); *G06F 12/16* (2013.01)

(58) Field of Classification Search
CPC ......... H03M 7/6088; H03M 7/38; G06F 3/06; G06F 9/50; G06F 12/16
See application file for complete search history.

(56) References Cited

U.S. PATENT DOCUMENTS

| | | |
|---|---|---|
| 10,171,103 B1 | 1/2019 | Zevulun et al. |
| 10,275,375 B2 | 4/2019 | Ayoub |
| 10,616,113 B2 | 4/2020 | Levy et al. |
| 2008/0228864 A1* | 9/2008 | Plamondon ........... H04L 67/568 709/203 |
| 2018/0121601 A1* | 5/2018 | Hahm .................... G16B 30/10 |
| 2019/0171612 A1 | 6/2019 | Shahar et al. |
| 2019/0373672 A1* | 12/2019 | Kim ...................... H04L 1/1642 |
| 2022/0014607 A1 | 1/2022 | Pilnik et al. |

FOREIGN PATENT DOCUMENTS

GB    2578421 A  *  5/2020  ........... G06F 3/0613

OTHER PUBLICATIONS

NVIDIA® UFM® platforms "revolutionize data center networking management by combining enhanced, real-time network telemetry" https://www.nvidia.com/en-us/networking/infiniband/ufm/.
ZFP computing.llnl.gov/projects/zfp/zfp-compression-ratio-and-quality.
NVIDIA® NetQ™—docs.nvidia.com/networking-ethernet-software/cumulus-netq-41/pdf/.

(Continued)

*Primary Examiner* — Joseph J Lauture
(74) *Attorney, Agent, or Firm* — Meitar Patents Ltd.; Daniel Kligler

(57) ABSTRACT

A data compression system comprising computer memory to store plural compression algorithms and a hardware processor to apply compression algorithm/s to incoming data items, wherein the compression algorithm to be applied to individual data item/s from among the incoming data items is selected, from among the plural compression algorithms, by the hardware processor, depending at least on the individual data item.

28 Claims, 2 Drawing Sheets

(56) References Cited

OTHER PUBLICATIONS

NVIDIA® NetQ™—https://docs.nvidia.com/networking-ethernet-software/cumulus-netq-42/.
zfp.readthedocs.io/en/release0.5.5/modes.html.
docs.nvidia.com/doca/sdk/doca-libraries-api/modules.html.
Hsu, D. (2017). Time series compression based on adaptive piecewise recurrent autoencoder. arXiv preprint arXiv:1707.07961.
"Squash" benchmark for compression algorithms (https://quixdb.github.io/squash-benchmark/).
Xing, R. (2018). The Compression of IoT operational data time series in vehicle embedded systems.
Dingwen T. GPU-Accelerated Lossless Compression Survey (Sep. 10, 2020) https://github.com/dingwentao/GPU-lossless-compression.
Lindstrom P. "SciVIS 2014: Fixed-Rate Compressed Floating-Point Arrays" (May 18, 2018)—https://vimeo.com/270706722.
Sakharnykh N., LaSalle D. and Karsin B. "Optimizing Data Transfer Using Lossless Compression with NVIDIA nvcomp" (Dec. 18, 2020) https://developer.nvidia.com/blog/optimizing-data-transfer-using-lossless-compression-with-nvcomp/.
LLN-CODE-663824, "Compression Modes—zfp 0.5.4 documentation," pp. 1-4, year 2014-2018, as downloaded from zfp.readthedocs.io/en/release0.5.4/modes.html.
LLN-CODE-663824, "Compression Modes—zfp 0.5.4 documentation," pp. 1-3, year 2014-2019, as downloaded from zfp.readthedocs.io/en/release0.5.5/modes.html.
Dingwen T., "GPU-Accelerated Lossless Compression Survey", pp. 1-6, Sep. 10, 2020, as downloaded from https://github.com/dingwentao/GPU-lossless-compression.
Hsu, D., "Time Series Compression Based on Adaptive Piecewise Recurrent Autoencoder", pages Aug. 16, 2017, as downloaded from https://arxiv.org/pdf/1707.07961.pdf.
NVIDIA, "DOCA SDK Documentation—Modules", p. 1, last updated Jan. 19, 2022, as downloaded from https://docs.nvidia.com/doca/sdk/doca-libraries-api/modules.html.
NVIDIA, "NVIDIA NetQ 4.2 User Guide", p. 1-2, year 2022, as downloaded from https://docs.nvidia.com/networking-ethernet-software/cumulus-netq-42/.
Sakhamykh et al., "Optimizing Data Transfer Using Lossless Compression with NVIDIA nvcomp", pp. 1-7, Dec. 18, 2020, as downloaded from https://developer.nvidia.com/blog/optimizing-data-transfer-using-lossless-compression-with-nvcomp/.
Lindstrom, P., "SciVIS 2014: Fixed-Rate Compressed Floating-Point Arrays", p. 1, May 18, 2018, as downloaded from https://vimeo.com/270706722.
"Squash Compression Benchmark", pp. 1-24, year 2015, as downloaded from http://quixdb.github.io/squash-benchmark/.
NVIDIA, "NVIDIA Unified Fabric Manager", pp. 1-6, year 2022, as downloaded from https://web.archive.org/web/20220601161235/https://www.nvidia.com/en-us/networking/infiniband/ufm/.
Xing, R., "The compression of IoT operational data time series in vehicle embedded systems", Degree Project in Computer Science and Computer Engineering, pp. 1-95, Stockholm, Sweden, year 2018.
Lawrence Livermore National Laboratory, "zfp Compression Ratio and Quality", pp. 1-4, year 2022, pages as downloaded from https://computing.llnl.gov/projects/zfp/zfp-compression-ratio-and-quality.
NVIDIA, "NVIDIA Cumulus NetQ 4.1 User Guide", p. 1-581, year 2022, as downloaded from https://docs.nvidia.com/networking-ethernet-software/cumulus-netq-41/pdf/.
Tonoyan et al., U.S. Appl. No. 17/828,162, filed May 31, 2022.

\* cited by examiner

| Data[0] | $argmax_i s$ (Data[0]) |
| Data[1] | $argmax_i s$ (Data[1]) |
| ⋮ | |
| Data[M-1] | $argmax_i s$ (Data[M-1]) |

COMPRESSION STRATEGY SELECTION POWERED BY MACHINE LEARNING

FIELD

This invention relates generally to data compression.

BACKGROUND

NVIDIA® UFM® platforms "revolutionize data center networking management by combining enhanced, real-time network telemetry" e.g., as described here: https://www.nvidia.com/en-us/networking/infiniband/ufm/.

NVIDIA® NetQ™ is an example of a "highly scalable, modern network operations tool set that provides visibility and troubleshooting of your overlay and underlay networks in real-time. NetQ delivers actionable insights and operational intelligence about the health of your data center—from the container, virtual machine, or host, all the way to the switch and port", according to the following online source: https://docs.nvidia.com/networking-ethernet-software/cumulus-netq-42/.

ZFP compression is described online here: computing.llnl.gov/projects/zfp/zfp-compression-ratio-and-quality.

SUMMARY OF THE DISCLOSURE

Certain embodiments seek to provide a data-driven compression system e.g., as described anywhere herein.

Certain embodiments seek to provide a data compression system with compression algorithm selection functionality where a compression algorithm is selected, depending at least partly on which data is to be compressed. The term "compression algorithm", when used herein, may refer, according to context, generally to a pair of algorithms in the sense of software routines, one software routine (one member of the pair) to compress on a transmitter side, and another software routine (another member of the pair) to decompress on a receiver side, or the term may refer specifically to the software routine for compressing on the transmitter side.

Certain embodiments seek to provide machine language-powered compression strategy selection.

Certain embodiments seek to provide a method to estimate a best compression strategy/algorithm in real time, e.g., depending on which data is flowing into the system, based on ML/AI, where best-ness may be defined using metric balancing, or combining each compression algorithm's error rate and/or each compression algorithm's compression ratio e.g., as described anywhere herein.

Certain embodiments seek to provide a model which, once deployed, determines a compression algorithm e.g., for every new data vector, with which data is compressed, then sent, then decompressed by retrieving the decompression code of the same compression algorithm. The model typically selects the algorithm from among plural algorithms, each of which is typically retrieved when the model selects an "algorithm index" which is a unique identifier of a certain one of the plural algorithms.

At least the following embodiments are contemplated:
Embodiment 1. A data compression system comprising:
a computer memory to store plural compression algorithms; and/or
a hardware processor to apply at least one picked compression algorithm to incoming data items, wherein the picked compression algorithm to be applied to at least one individual data item from among the incoming data items is selected, from among the plural compression algorithms, by the hardware processor, depending at least on the individual data item.

Embodiment 2. The system according to any of the preceding embodiments wherein the computer memory is to store the plural compression algorithms in association with respective plural data-item classes, and wherein a machine learning model is used to select the picked compression algorithm from among the plural compression algorithms by using the hardware processor, for at least one individual data item from among the incoming data items, to classify the individual data item as belonging to a class C from among the plural data-item classes and to select a compression algorithm associated with class C in the computer memory, as the picked compression algorithm for the individual data item.

Embodiment 3. The system according to any of the preceding embodiments wherein the processor is deployed in a data center networking management platform with network telemetry functionality and wherein the incoming data items store network telemetry data.

Embodiment 4. The system according to any of the preceding embodiments wherein the network telemetry data comprises time series data.

Embodiment 5. The system according to any of the preceding embodiments wherein the incoming data items are generated by a network operations tool set that provides network visibility in real time.

Embodiment 6. A data compression method comprising using a hardware processor for:
predicting a best compression algorithm for each of plural incoming data items, thereby to define plural best compression algorithms for the plural items respectively; and
performing at least one of the following operations, A and B:
Operation A: for each data item A from among the plural items, which is to be compressed, retrieving compression code corresponding to a best algorithm A defined for item A by the predicting, and compressing the item A by running the compression code on the item A; and/or
Operation B: for each data item B from among the plural items, which is compressed, retrieving decompression code corresponding to the best algorithm B defined for item B by the predicting, and decompressing the item B by running the decompression code on the item B.

Embodiment 7. The system according to any of the preceding embodiments wherein at least the processor is deployed in a communication system including at least one transmitter and at least one receiver, thereby to define a transmitter side of the system and a receiver side of the system.

Embodiment 8. The system according to any of the preceding embodiments wherein the processor uses a trained model to select the picked compression algorithm and wherein the trained model is deployed only in the transmitter and not in the receiver.

Embodiment 9. The system according to any of the preceding embodiments wherein the transmitter side of the system is implemented by a dedicated hardware accelerator.

Embodiment 10. The system according to any of the preceding embodiments wherein the transmitter side of the system is implemented by a GPU (graphics processing unit).

Embodiment 11. The system according to any of the preceding embodiments wherein the processor uses a trained model to select the picked compression algorithm and wherein the model is accelerated using a GPU.

Embodiment 12. The system according to any of the preceding embodiments wherein the processor is configured in software to select and apply the picked compression algorithm to incoming data items and wherein the plural compression algorithms are offloaded to hardware.

Embodiment 13. The system according to any of the preceding embodiments wherein the plural compression algorithms are offloaded to a GPU.

Embodiment 14. The system according to any of the preceding embodiments wherein for each individual data item from among the incoming data items, the processor classifies the individual data item as belonging to a class C from among the plural data-item classes.

Embodiment 15. The system according to any of the preceding embodiments wherein for each individual data item from among the incoming data items, the processor selects the candidate compression algorithm associated with class C, as the suitable compression algorithm for the individual data item.

Embodiment 16. The system according to any of the preceding embodiments wherein, for at least one individual data item from among the incoming data items, the processor, in real time, classifies the individual data item as belonging to class C and, in real time, selects the candidate compression algorithm associated with class C, as the suitable compression algorithm for the individual data item.

Embodiment 17. The system according to any of the preceding embodiments wherein, for at least one individual data item from among the incoming data items, the processor, in near real time, classifies the individual data item as belonging to class C and, in near real time, selects the candidate compression algorithm associated with class C, as the suitable compression algorithm for the individual data item.

Embodiment 18. The system according to any of the preceding embodiments wherein the incoming data items comprise an incoming stream of data including first and second data items and wherein the processor, in real time, classifies the first data item as belonging to class C1 and the second data item as belonging to class C2 and, in real time, compresses the first data item by applying the candidate compression algorithm associated with class C1 to the first data item and compresses the second data item by applying the candidate compression algorithm associated with class C2 to the second data item.

Embodiment 19. The system according to any of the preceding embodiments, wherein the hardware processor selects the picked compression algorithm using a machine learning model and employs a best-ness criterion which is a function of plural characteristics of each compression algorithm and wherein the plural characteristics are all normalized to a single range and then combined using a combination function.

Embodiment 20. The system according to any of the preceding embodiments wherein the combination function comprises an average.

Embodiment 21. The system according to any of the preceding embodiments wherein the average comprises a weighted average.

Embodiment 22. The system according to any of the preceding embodiments wherein best-ness is a function of each compression algorithm's error rate.

Embodiment 23. The system according to any of the preceding embodiments wherein best-ness is a function of each compression algorithm's compression ratio.

Embodiment 24. The system according to any of the preceding embodiments wherein each compression algorithm's best-ness is represented by a compression score and wherein, in an event of a draw or near-draw, at least one factor unrelated to data items is used to determine a best algorithm from among the plural algorithms.

Embodiment 25. The system according to any of the preceding embodiments wherein the factor is based at least partly on each algorithm's runtime.

Embodiment 26. The system according to any of the preceding embodiments wherein the error rate uses an MAPE or sMAPE metric.

Embodiment 27. The method according to any of the preceding embodiments and wherein the predicting occurs in real time or near-real time.

Embodiment 28. The method according to any of the preceding embodiments, and also comprising using a hardware processor for performing, offline, the following:
creating a dataset with plural data entries, each including a data item paired with an indication of a best compression algorithm for that data item;
training a model to predict a best compression algorithm for each incoming data item, using the dataset as training data, thereby to provide a trained model; and
deploying the trained model.

Embodiment 29. The method according to any of the preceding embodiments wherein the trained model comprises a classifier.

Embodiment 30. The method according to any of the preceding embodiments and wherein the trained model is deployed in a transmitter.

Embodiment 31. The system according to any of the preceding embodiments wherein the model comprises a deep neural network which is offloaded to the GPU.

BRIEF DESCRIPTION OF THE DRAWINGS

FIG. 3, as illustrated, assumes a data transmission use-case in which data is being sent from a transmitter to a receiver, however this is not intended to be limiting.

DETAILED DESCRIPTION OF CERTAIN EMBODIMENTS

The term "algorithm index" is used herein to include any identifier, typically a unique identifier, which enables a user of the system herein to retrieve and use, for compression or decompression, code for a certain algorithm associated in memory with that index, rather than other algorithms which are not associated in memory with that index and may be associated in memory with other indices. The indices for a set of M available algorithms may, by way of non-limiting example, be a set of integers e.g., a sequence of consecutive natural numbers such as 0, 1, . . . . M−1.

Any suitable technology may be employed to implement retrieval e.g., using labels, tags, or a hash table, by way of non-limiting examples.

The term "telemetry" is used herein to include any monitoring technology used to collect data (e.g., counter values) from hardware devices, typically remotely. Telemetry typically comprises both local collection of data (e.g. sensed measurements, such as how many packages were received, sent, or dropped locally) by counter/s at one or more locations e.g. servers or routers, and transmission of that data to one or more remote receivers e.g. for monitoring. However, references to telemetry herein may be replaced by local collection of data without transmission of that data outward to any remote receiver.

Figures 1, 2:
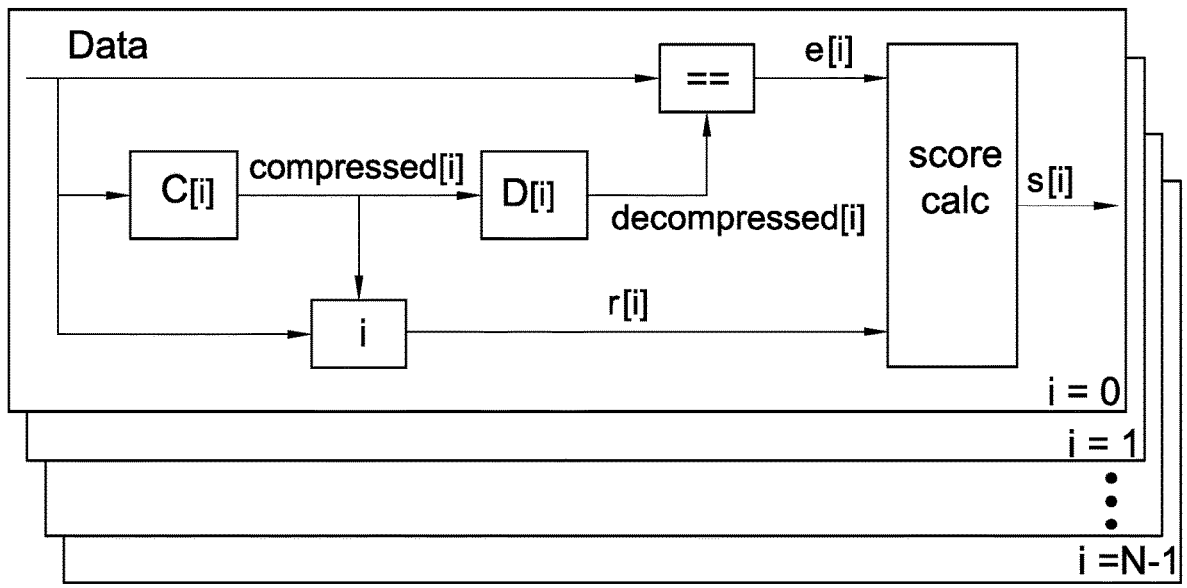
FIG. 1 is a simplified block diagram illustration of an offline dataset creation process in accordance with an embodiment of the invention, yielding an example dataset which may be used as a training set when machine-learning how to predict a best compression algorithm for various incoming data items.
FIG. 2 is a diagram of an example dataset, including records, denoted as rows, which each include a representation of at least one data item, and an indicator of at least one compression algorithm which is suitable for compressing the at least one data item within the same record. Typically, each record in the dataset includes an entire single data item. Typically, for each data item in the dataset, a classification label (class, in the form of class index, for example) is provided, for the best algorithm to be used e.g., the classification label is selected using a "best-ness" function based on compression metrics over the data item.

Referring now to FIG. 1, a system and method are now described in detail, which typically build or create a dataset (e.g. the dataset shown in FIG. 2), in which, typically, each entry or record or row comprises at least two fields, the first field storing a data item (e.g. Data[0] etc., shown in the first column of FIG. 2) and the second field storing an algorithm index (e.g. the argmax's shown in the second column of FIG. 2). Argmax determines, e.g., selects, the x that yields the maximum score. Thus, typically, Argmax(f(x),x) yields the index or output label (x) which maximizes f(x) AKA y.

Each entry or record or row may comprise a bitstream/vector of some type such as (by way of non-limiting example) uint32.

Typically, the algorithm index refers to (e.g., using an identification function as described herein) a specific compression algorithm within a list or set of compression algorithms available to run. For example, this list or set may include all compression algorithms supported by a product (say, UFM or NetQ or other telemetry product) in which the system herein is being deployed.

Each algorithm may be either lossy or lossless. Different algorithms in the list of sets, corresponding to two different indices, may differ only in their configuration parameter values.

Typically, once the dataset has been built, an AI model is trained to estimate the algorithm index, depending on the data to be compressed e.g., according to any of the embodiments herein.

In runtime, when the trained model and compression algorithms list/set are deployed, the AI model estimates, typically in real time or near-real time, a best algorithm for applied data e.g., for data on which the compression algorithm is to run, and then, typically, this best algorithm is then employed to compress/decompress the data, at least until the AI model is next activated.

Thus FIG. 1 is a simplified block diagram illustration of dataset creation which typically occurs offline and typically precedes runtime.

To create the first column (FIG. 2) of the dataset, use an available set of data items, typically including a variety of data items spanning the anticipated universe of data items, given the anticipated use case/s. To create the second column of the dataset in FIG. 2, each data item may be passed through the pipeline shown in FIG. 1, terminating in the "score calc" block. In the pipeline, the C[i], D[i] blocks signify the compression and decompression code, respectively, for each of the algorithms whose algorithm indices are i=0, . . . . N−1. Thus, each data item passes through C[i], which may compress and may compute a compression ratio r[i] for that data item. C[i] may also pass the compressed data item to D[i], take the decompressed output data, compare the decompressed output data to original data (e.g., the data fed into C[i]), and, accordingly, compute an error rate, e[i] e.g., by subtraction, for that data item. The ratio r[i], and error rate e[i] may then be fed into the score calculator block of FIG. 1, to generate a single, typically scalar compression "score" for the algorithm application over the data. Typically, the compression scores reflect the best-ness of the algorithm (e.g., the best algorithm's score is higher than the scores of all other available algorithms, or, alternatively, the best algorithm's score is lower than the scores of all other available algorithms) and all compression score computations may be designed to ensure that a larger score means better compression (lower error and/or higher ratio). Alternatively, however, all compression score computations may be designed to ensure that a larger score means worse compression (higher error and/or lower ratio).

Typically, this process is carried out for each of the compression algorithms (<C,D> pairs) in a list or set or pool of available algorithms. It is appreciated that the term "compression algorithm" may be interpreted as denoting both the C member of the pair and the D member of the pair or may be interpreted as denoting only the C member of the pair. Eventually, the algorithm index of the algorithm which optimized, e.g., maximized, the compression score for a given data item, is taken into the relevant dataset entry, e.g., as shown in FIG. 2, thereby to yield a record, in the dataset, which includes the given data item and an indication of, e.g., algorithm index of, the algorithm which optimally compressed that given data item.

Thus, in the training stage, which typically precedes runtime, dataset creation may include building a function that calculates the score from compression metrics (error, comp. ratio, other factors); and/or, typically for each data example (e.g., data vector as described herein):

a. running all algorithms in the algorithms pool and after each run computing each algorithm's score; and/or b. selecting, e.g., for each data example the algorithm index of the algorithm that is "best" because that algorithm maximizes or optimizes the score for the data (e.g., for that data example).

c. generating a dataset entry including [data e.g., the data example, algorithm index] where the algorithm index is that selected in operation b for that data example.

A reverse mapping (from algorithm, to algorithm index) may be used. This may, by way of non-limiting example, be a function from (say) algorithm name such as "ZFP", or any other designator, to an algorithm index or a dictionary.

Any suitable method for compression score computation may be employed by the score calculator block of FIG. 1. Typically, the compression score is a function of both the error rate e and compression ratio r. The ratio may be defined as r=(length of compressed data)/(length of original data), yielding a real number in the range [0,1]. The compression score may increase as this ratio decreases.

Error rate may be defined using any suitable error metric to reflect the difference between decompressed data from original data, and is typically normalized in the [0,1] range to be compatible with the range of the compression ratio, thereby to facilitate combination into a single compression score. This can vary over data types. For example, if data items are time series metrics (e.g., for network telemetry use cases), MAPE/sMAPE (mean absolute percentage error or Symmetric mean absolute percentage error) may be used as the error metric, normalized to [0,1] range). The compression score may increase as this error rate decreases.

It is appreciated that MAPE or sMAPE metrics are merely non-limiting examples of error metrics defined over a series, and any other error metric may be employed instead, if and as suitable, for a data item which comprises a list of values compressed together, for example a window of time series samples.

The ratio and error rate of each compression algorithm are typically normalized to [0,1] so they can be meaningfully combined to generate a single compression score, S, for each algorithm.

To tradeoff between the ratio and error rate, different levels of importance or weights may be assigned to each.

For example, there may be a use-case where the ratio has high variance, whereas the error rate is low, and/or errors tend to occur in uninteresting places (e.g., spikes are preserved, unaffected by the errors, and since location of spikes is what is important in a given use-case, the errors are uninteresting. In such a use-case, ratio might be weighted higher than error rate.

Alternatively, there may be use-cases in which the values of the data items themselves are particularly important. In such a use-case, ratio may be weighted lower than error rate.

It is appreciated that alternatively or in addition, other parameters such as, by way of non-limiting example, latency and/or processing power, may be taken into consideration.

A parameter $\alpha$ may be defined, in range [0,1], to weight the ratio e.g., in the following compression scores s_0 and s_1, by way of non-limiting example:

$$S = s\_0 = 1 - \alpha r - (1-\alpha)e$$

and/or $$S = s\_1 = 1/(\alpha r + (1-\alpha)e)$$

This framework may be enhanced or modified to generate other tradeoffs between ratio and error rate. The compression score may be any descending function of (normalized) e and/or ascending function of (normalized)r, in which case a higher score is more optimal. Alternatively, the compression score may be any ascending function of (normalized)e and/or descending function of (normalized)r, in which case lower scores are more optimal.

It is appreciated that other factors (e.g., measured runtime and/or average known runtime, and/or any other central tendency such as median or mode), can be combined to determine a best algorithm e.g., for cases in which plural algorithms earn the same score (a draw), or if there is a below-threshold difference between compression scores of plural algorithms (near-draw). For example, if the plural compression algorithms include plural ZFP algorithms, each with different parameter values, which all earn the same score which exceeds the score of all other algorithms in the pool, a runtime parameter may be employed to determine which of the ZFP algorithms will be deemed best. For example, since ZFP algorithms typically have rate, precision, and tolerance parameters, there may be 2 ZFP algorithms, including a first ZFP algorithm which has a first rate value, a first precision value, and a first tolerance value, and a second ZFP algorithm, which has a second rate value, second precision value, and second tolerance value, any or all of which may differ from the corresponding values of the first ZFP algorithm's parameters.

Once a dataset has been created, the method typically includes the classification problem of developing a classification model that predicts an algorithm index of a "best" compression algorithm for application to any given data. Any suitable AI methods may be deployed, and this may vary across the type of data. For signal data, such as telemetry or image data, as well as for natural language (text) data, Deep Neural Networks may be a suitable AI method to use to develop the classification model, whereas for other types of data (tables), tree models may be a suitable AI method to use to develop the classification model.

Thus, the machine learning model may be used to select a picked compression algorithm from among, say, M compression algorithms by classifying an individual data item I as belonging to a class C from among M data-item classes, and to select a compression algorithm associated with class C in computer memory as the picked compression algorithm for the individual data item I.

Any suitable training data may be employed to train the model. For example, in a network telemetry use case, real data may be collected from a given network of interest. Agents or telemetry aggregator/s such as OPTA may collect agent data. Typically, agents are at network nodes, whereas an OPTA may collect from multiple agents. The system herein may, for example, be deployed at an OPTA.

A description of how to "Install the OPTA Server" appears in the following online source: docs.nvidia.com/networking-ethernet-software/cumulus-netq-41/pdf/. It is appreciated that OPTA, NetQ's telemetry aggregator, is an example of a server to which NetQ (say) agents, which may for example be deployed on individual network devices or hosts, stream data, en route to NetQ where NetQ is a non-limiting example of a telemetry tool.

Figure 3:
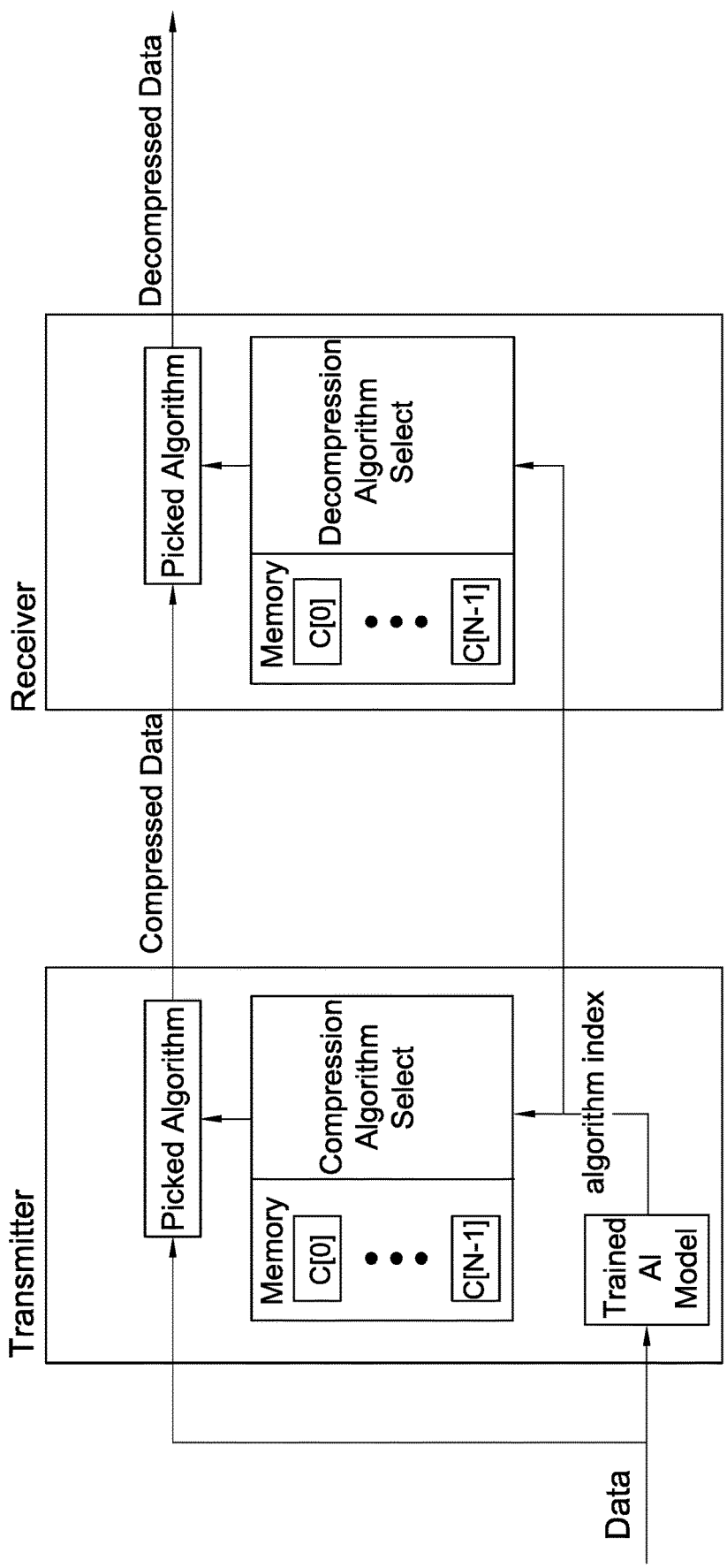
FIG. 3 is a diagram of a machine language-powered compression system, which may be operative in conjunction with the embodiment/s of FIG. 1 and/or FIG. 2, and which is typically operative in real time or near real-time.

Referring now to FIG. 3, once the model has been trained (e.g., once the classification has been developed), the trained model may be deployed, e.g., may be incorporated into a processor at the transmitter end. Then, data, when received, is fed to the AI model which estimates the algorithm index of the best compression algorithm. Then, only the picked algorithm (the "best" algorithm associated with the algorithm index) is used for compression (e.g., by the transmitter) and decompression (e.g., by the receiver) of that data.

Typically, each device in the data compression system of FIG. 3 includes computer memory to store plural compression algorithms C[0], . . . C[N–1] as shown. Since each device typically assumes both a transmitter role and a receiver role, what is stored in memory for each algorithm typically comprises software routines for both compressing and decompressing.

A hardware processor to apply at least one picked compression algorithm to incoming data items, wherein the picked compression algorithm to be applied to at least one individual data item from among the incoming data items is selected, from among the plural compression algorithms, by the hardware processor, depending at least on the individual data item.

It is appreciated that the data compression system shown in FIG. 3 is but an example deployment, which shows, for simplicity, only two devices, one of which is acting at a given time as a transmitter and the other of which is acting at a receiver at the given time, receiving data from the transmitter. At the same time or another time, the illustrated devices may have other roles. For example, the device shown in FIG. 3 to be serving as a transmitter may serve as a receiver for some (other) transmitter, and/or the device shown in FIG. 3 to be serving as a receiver may serve as a transmitter for some (other) receiver. Each device may comprise a switch, server, DPU, or any other network node.

As shown, typically, data streams into a processor at the transmitter end and is fed to the current best ("picked") algorithm which compresses the data and to the trained model which (typically continuously) selects an algorithm index of a "best" algorithm for compressing. The trained model typically supplies the algorithm indices to "select" modules in the transmitter's processor and in a processor at the receiver end, typically for algorithms for compressing and for decompression, respectively. Thus, the transmitter processor's select module typically selects compression code according to the "best" algorithm index, as opposed to the receiver end processor, whose select module typically selects decompression code according to the "best" algorithm index. The data, compressed using compression code stored for the "picked algorithm" associated with the best algorithm index, is supplied to the receiver, which decompresses using decompression code stored for the "picked algorithm" associated with the best algorithm index.

According to one embodiment, "algorithm select" blocks are provided on both ends of the communication system, such that each TX and RX are served by local "algorithm select" blocks. According to other embodiments, a single algorithm select block may serve both transmitter and receiver. According to certain embodiments, an algorithm select block on the transmitter side transmits data to an RX and this data includes an indication (e.g., index) of the decompression "picked algorithm" rather than the receiver relying on a local algorithm select block to obtain an index of the decompression "picked algorithm". According to some embodiments, multiple decompression algorithms are stored in association with a single compression algorithm and/or multiple compression algorithms are stored in association with a single decompression algorithm.

One possible use-case for the systems and methods herein is telemetry e.g., network telemetry, for telemetry platforms or applications such as, for example, the NVIDIA® Mellanox® Unified Fabric Manager (UFM®) Telemetry platform or NetQ, which is a network operations tool that utilizes telemetry for deep troubleshooting, visibility, and automated workflows from a single GUI interface, reducing maintenance and network downtimes. In this use-case, implementation may, for example, be software driven, with HW acceleration e.g., GPU acceleration.

In network telemetry use-cases, an agent (aka telemetry agent) may be deployed on each device (e.g., on at least one switch/server/DPU/node shown in FIG. 3). The agent typically samples various kinds of counters, typically aggregates each counter's samples to bulks as a vector, and uses the system shown and described herein to compress e.g., specifically for this specific type of data. On the other (receiver) end, which may, for example, comprise an aggregator/collector in a cloud, data may be opened by decompression e.g., as described herein. It is appreciated that compression may be performed by a telemetry agent on the relevant transmitter, however this is not intended to be limiting. Also, decompression may be performed by a telemetry agent on the relevant receiver, however this is not intended to be limiting. Alternatively, for example, compression may be performed not on the transmitter's telemetry agent, but elsewhere on the transmitter device, and/or decompression may be performed not on the receiver's telemetry agent, but elsewhere on the receiver device.

It is appreciated that plural (several or many) discrete counters may be provided at a single node e.g., one counter tallying how many packets were sent, another counting how many were received, a third tallying how many were dropped, and so forth.

It is appreciated that for software driven implementation, the software (e.g. data item-algorithm index dataset (of FIG. 1 e.g.) and/or code implementing the compression algorithms and/or configuration parameter values for the algorithms and/or data items and/or classifier and/or code that applies the compression algorithm and/or code that gets the classifier output and fetches the right compression algorithm) may reside at any suitable location i.e. is typically not location-sensitive, other than as specifically described herein.

According to certain embodiments, a library of software code is provided in memory, including code for each of a pool or set of different algorithms, typically including software routines for both sides of the algorithm e.g., for each algorithm (e.g., for ZFP), the library may store one software routine for the compression side and another software routine for the decompression side. It is appreciated that if various algorithms differ only in their parameters, then the library may store the following:

A. a single software routine for the compression side of all these algorithms, and a single software routine for the decompression side of all these algorithms; and b. an indication of the parameter values for the first of the various algorithms, for the second of the various algorithms, and so forth.

This enables a given software routine for (say) compression to be run using any of the parameter values stored, depending on which of the various algorithms is picked or selected.

Routines for compression may be stored in a library deployed on a transmitter node and routines for decompression may be stored in a library deployed on a receiver node, however, in practice, since devices may function as both transmitters and receivers, a library on the device typically stores both routines for compressing and routines for decompressing, for each of various algorithms.

The library may use suitable hardware acceleration e.g., GPU acceleration, or any other type of HW acceleration (e.g., ASIC (compression/decompression), "core" inside an ASIC; special purpose HW device; FPGA) for the compression/decompression task, since some algorithms are known in the art to be operable for a particular type of compression. It is appreciated that some algorithms are suited for accelerations and other algorithms may be less suitable for acceleration.

Some algorithms have free parameters or configuration parameters. For example, e.g., for telemetry use-cases, the ZFP algorithm "accepts one or more parameters for specifying how the data is to be compressed to meet various constraints on accuracy or size. At a high level, there are five different compression modes that are mutually exclusive: expert, fixed-rate, fixed-precision, fixed-accuracy, and reversible mode. The user has to select one of these modes and its corresponding parameters", according to the following online source: zfp.readthedocs.io/en/release0.5.5/modes.html. The ZFP algorithm's configuration parameters typically include rate, precision, and tolerance, according to the following online source: zfp.readthedocs.io/en/release0.5.4/modes.html.

Typically, when an algorithm is selected, the selection process includes a specific assignment of the selected algorithm's free parameters or configuration parameters, if any. For example, plural indices may be associated with a single algorithm with plural assigned values to the single algorithm's parameters. An identification function may be provided which takes in or receives an algorithm index and maps the algorithm index into an algorithm (compression+decompression with specific parameter assignments) in the pool or set or list of algorithms.

A machine learning model may be used for selecting a "best" compression algorithm; this may include both code and a stored indication (e.g., file storing) assignment, or definition of weights, which may be an outcome of training done before operational/runtime usage of the system shown and described herein. The ML model can be accelerated using GPU, if supported (native, if the model is a deep learning model).

Typically, if the model is a deep learning model, data is fed directly to the model. Alternatively, if the model is not a deep learning model, data can pass through a feature extractor to yield a feature vector which may include any suitable properties of the data, such as, by way of non-limiting example, any aspect of the input metadata, and/or the average changed number of bits between vector items. For example, given the vector $[v[0], v[1], \ldots, v[i] \ldots]$, this average may be:

$$\text{AVG}(\text{number\_of\_changed\_bits}(v[i], v[i+1])).$$

The code included in the "best" compression algorithm may be fed with data to-be-compressed, which may comprise a bitstream of a fixed size and/or a vector of bytes and/or a vector of other type such as uint32 (e.g. as used in this online reference: docs.nvidia.com/doca/sdk/doca-libraries-api/modules.html). The included code may receive or input metadata such as, for example, the rate the data was sent with, and may return an algorithm index for a best algorithm for the data-to-be-compressed. For example, data related to telemetry (e.g., network telemetry) may include a data vector comprising 8K samples of an integer counter (uint32) and metadata indicating the sampling rate e.g., 1 sample/sec.

A transmit code (function) may be provided, which may take data, run the ML model, take the algorithm index generated by the ML model, and use an identification function, to get a compression algorithm associated with the algorithm index, run that compression, yielding compressed data, and send the compressed data with the index e.g., by sending a message holding [algorithm index, compressedData]). According to an embodiment, this function runs at one end of a communication channel e.g., at the transmitter end. In a (e.g., network telemetry) use-case, this function may run in a telemetry agent, and may run for every new bulk of related samples. For example, a sampled counter may be sampled 8K times, and the resulting 8K samples may be packed into a vector with related input metadata, and then fed to the transmit code/function.

A receive code (function) may also be provided and may be fed with compressed data and an algorithm index. This algorithm index may be fed to an identification function to retrieve a decompression function or algorithm, and then the compressed data may be decompressed using this algorithm (aka decomp function). This function (which converts algorithm index to algorithm name/function pointer) runs in the other (receiving) end of the communication channel. In the network telemetry example, the function typically runs, typically for every new message received, in a telemetry collector which receives data from agents.

A suitable method of operation included within the scope of the present invention is the following, which includes operations performed offline, and operations performed in runtime:

Offline
  A. Create dataset with plural data entries, each including a data item paired with indication of (e.g., index referring to) best available compression algorithm for that data item
  B. Train AI model to predict a best compression algorithm for each incoming data item, using dataset as created above as the training data
  C. Deploy trained AI model e.g., in transmitter
In Real Time or Near-Real Time, Typically Continuously:
  D. Provide data
  E. AI model predicts a best compression algorithm for each incoming data item (e.g., classifier derives algorithm index from data)
  F. At transmitter end, compression code corresponding to best algorithm is retrieved (e.g., from a library, or by calling a file previously imported), and applied to each incoming data item
  G. At receiver end, where incoming data is compressed, retrieve decompression code corresponding to best algorithm, and apply to each incoming compressed data item.

A particular advantage of certain embodiments is that state of the art computing infrastructures are experiencing an explosion of data and/or ever-increasing requirements to collect that data. Various tiers (data communication and/or storage and/or compute infrastructure—typically all, and especially the first two, communication and storage) are affected and stressed. Embodiments herein provide mitigation strategies, using improved compression to ease this stress on infrastructure. Compression is improved at least by exploiting the hugeness of the data, rather than merely suffering from it, by optimization of machine learning and AI, yielding an estimation, typically in real time or near-real time, of a best strategy or algorithm for compression, using any suitable best-ness criterion, which may, for example, take into account requirements for compression ratio and/or for error rate. This facilitates higher compression rates with smaller error rates, breaking down the conventional tradeoff between these two requirements, and running only the best compression algorithm during data transmission and/or during storing, thereby to achieve a compute-efficient system. For example, because the system predetermines which algorithm/model to run in advance, and not in run-time, the system's algorithmic efficiency is higher than a naïve system which, in real time, determines which algorithm/model to run from among, say, 2 or 3 algorithms/models available, e.g., by selecting a model by trial and error which is conducted in real time. The naïve system would, unlike the more efficient embodiments herein, expend compute, or computer resources, in identifying which model is best to select at runtime.

EXAMPLE IMPLEMENTATIONS

Included in the scope of the present invention is a transmit-receive system, according to any embodiment described herein, which is entirely implemented in software, e.g., if an embedded agent side does not have a GPU or does not provide HW acceleration.

Also included in the scope of the present invention is a transmit-receive system, according to any embodiment described herein, which is driven by SW, other than an ML model accelerated in a GPU. For example, given an agent residing in a powerful system, an ML model can be accelerated using GPU to provide higher performance. If the model is a deep neural network, a suitable software wrapper (such as, say, Pytorch or Tensorflow) may be employed for offloading such a model to GPU.

Yet another alternative is to provide a transmit-receive system according to any embodiment herein which is entirely software driven other than the ML model which is accelerated in GPU and the compression/decompression algorithms which may be offloaded to HW e.g., GPU. This embodiment is suitable, for example, in use-cases where both ends are powerful systems. For example, a receiver may be a highly capable system if the receiver aggregates from multiple agents.

Still another alternative is to provide a transmit-receive system according to any embodiment herein, whose agent is completely HW implemented, and whose receiver (collector) side implementation is software based, either entirely, or with HW e.g. GPU acceleration. The transmitter side may be implemented entirely in hardware e.g., using a dedicated hardware accelerator. For example, given a switch/DPU, an HW engine may accelerate directly rather than using GPU, if deploying a GPU is not convenient for some reason.

It is appreciated that a system may select a compression algorithm (also) depending on consideration/s other than the data itself e.g. what the use case is, what latency is needed, how much time is available, given the use-case, to compress and to de-compress, what processing power is available, etc. The machine learning model may receive metadata which is related to the data and which may come in with the data, and may, accordingly, determine a suitable compression algorithm accordingly, or at least partly accordingly. It is appreciated that compression/decompression algorithm properties, such as latency or processing power, may be integrated within the score function.

Any system shown and described herein may or may not be configured to be open to retraining in the field e.g., may or may not have a UI enabling a system administrator to define a different feature vector, "in the field". Thus, embodiments include:
  a. a model trained by any method shown and described herein which, once deployed, cannot be changed
  b. a model or feature extractor which may be modified e.g., if the system administrator loads a new file; and
  c. As in (b), however, additionally provide a training platform that offers a pool of compression/decompression algorithms and/or score functions, and/or feature extractor/s. If this is the case, an end-user can, via the platform, create variations for various types of data.

It is appreciated that embodiments herein are useful for a wide variety of compression use-cases e.g., for signals that are not natural and/or are not extensively researched, hence their behavior is not well known and/or signals which vary with time e.g. many different counters may be sampled from a network switch, over time, and one counter may behave very differently from another, over time (e.g. unicast packets counters vs. multicast packets counters). Using an ML based method as described herein enables quality of compression to be improved, by inferring a best compression algorithm to use, based on behavior of the data.

According to certain embodiments, the ML model comprises a classification model which is an end result of a classifier which has undergone machine learning and is now trained. Optionally, before any classifier is used, data is first roughly classified e.g., as either data or image or video, and a different classifier may then be used for each rough classification (e.g., a first classifier for images, and a second classifier for video data).

Typically, each time a data item presents, and, responsively, the trained classifier or other ML model selects a compression algorithm, a suitable processor calls code which implements the selected compression algorithm, typically including both compression code and decompression code, and sets the algorithm's configuration parameters, if any, e.g., as described herein.

According to certain embodiments, data items undergo initial categorization (say as being either data or image or video or (other categories), and then a different classifier is used for each category. Alternatively, the data source type is uniform (e.g., telemetry data—samples over time) but there may be considerable deviation, over time, in the data transported within this single data source type. For example, two different counters may be generating data and may produce totally different behaviors, hence should be compressed differently, or a single counter may produce totally different behaviors in different time windows, hence the data in each of these time-windows should be compressed differently).

According to certain embodiments, each data item may comprise a feature vector derived from raw data.

Any suitable compression algorithms may be employed here, such as, by way of non-limiting example: ZFP, LZ77, Lempel-Ziv-Renau (LZR), Lempel-Ziv-Storer-Szymanski (LZSS), DEFLATE (or SuperFast), Lempel-Ziv Markov chain Algorithm (LZMA), LZMA2, Multi-Layer Perceptron (MLP)-Based Compression, Binary coding, Quantization, Spatial domain transformation, None (No compression). The last (null) option may be added to the pool of compression algorithms (e.g., "bypass") e.g., for use cases which seek to minimize latency and are not sensitive to other metrics of performance. This may be done dynamically; one possible implementation which is not intended to be limiting is that the agent may mark given data as latency-sensitive, and then this given data will not be processed through the compression pipeline, and, instead, will pass through the system as-is.

The term "all" is used herein for simplicity, to describe example embodiments. It is appreciated however that, alternatively, whatever is said herein to be true of or to characterize or to pertain to, "all" members of, or "each" member of, or "every" member of, a certain set can also, in other embodiments, be true of, or characterize or pertain to, most but not all members of that set, or all but a few members of that set, or at least one (but less than all) member/s of the set.

It is appreciated that software components of the present invention may, if desired, be implemented in ROM (read only memory) form. The software components may, generally, be implemented in firmware or hardware, if desired, using conventional techniques. It is further appreciated that the software components may be instantiated, for example as a computer program product, or on a tangible medium. In some cases, it may be possible to instantiate the software components as a signal interpretable by an appropriate computer, although such an instantiation may be excluded in certain embodiments of the present invention.

It is appreciated that various features of the invention which are, for clarity, described in the contexts of separate embodiments, may also be provided in combination in a single embodiment. Conversely, various features of the invention which are, for brevity, described in the context of a single embodiment, may also be provided separately, or in any suitable sub-combination.

It will be appreciated by persons skilled in the art that the present invention is not limited by what has been particularly shown and described hereinabove. Rather the scope of the invention includes, inter alia, the appended claims and equivalents thereof.

The invention claimed is:

1. A data compression system comprising:
a computer memory to store plural compression algorithms; and
a hardware processor to apply at least one picked compression algorithm to incoming data items, wherein the picked compression algorithm to be applied to at least one individual data item from among the incoming data items is selected, from among the plural compression algorithms, by the hardware processor, depending at least on said individual data item,
wherein at least the processor is deployed in a communication system including at least one transmitter and at least one receiver, thereby to define a transmitter side of the system and a receiver side of the system, and
wherein the transmitter side of the system is implemented by a dedicated hardware accelerator,
wherein the hardware processor selects the picked compression algorithm using a machine learning model and employs a best-ness criterion which is a function of plural characteristics of each compression algorithm and wherein the plural characteristics are all normalized to a single range and then combined using a combination function.

2. The system according to claim 1 wherein the processor is deployed in a data center networking management platform with network telemetry functionality and wherein said incoming data items store network telemetry data.

3. The system according to claim 2 wherein said network telemetry data comprises time series data.

4. The system according to claim 1 wherein the incoming data items are generated by a network operations tool set that provides network visibility in real time.

5. The system according to claim 1 wherein the processor is configured in software to select and apply the picked compression algorithm to incoming data items and wherein the plural compression algorithms are offloaded to hardware.

6. The system according to claim 1 wherein for each individual data item from among the incoming data items, the processor selects the candidate compression algorithm associated with class C, as the suitable compression algorithm for said individual data item.

7. The system according to claim 1 wherein, for at least one individual data item from among the incoming data items, the processor, in real time, classifies said individual data item as belonging to class C and, in real time, selects the candidate compression algorithm associated with class C, as the suitable compression algorithm for said individual data item.

8. The system according to claim 1 wherein, for at least one individual data item from among the incoming data items, the processor, in near real time, classifies said individual data item as belonging to class C and, in near real time, selects the candidate compression algorithm associated with class C, as the suitable compression algorithm for said individual data item.

9. The system according to claim 1 wherein the incoming data items comprise an incoming stream of data including first and second data items and wherein the processor, in real time, classifies said first data item as belonging to class C1 and said second data item as belonging to class C2 and, in real time, compresses the first data item by applying the candidate compression algorithm associated with class C1 to the first data item and compresses the second data item by applying the candidate compression algorithm associated with class C2 to the second data item.

10. The system according to claim 1 wherein the combination function comprises an average.

11. The system according to claim 10 wherein the average comprises a weighted average.

12. The system according to claim 1 wherein best-ness is a function of each compression algorithm's error rate.

13. The system according to claim 12 wherein the error rate uses an MAPE or sMAPE metric.

14. The system according to claim 1 wherein best-ness is a function of each compression algorithm's compression ratio.

15. The system according to claim 1 wherein each compression algorithm's best-ness is represented by a compression score and wherein, in an event of a draw or near-draw, at least one factor unrelated to data items is used to determine a best algorithm from among the plural algorithms.

16. The system according to claim 15 wherein said factor is based at least partly on each algorithm's runtime.

17. A data compression system comprising:
a computer memory to store plural compression algorithms; and
a hardware processor to apply at least one picked compression algorithm to incoming data items, wherein the picked compression algorithm to be applied to at least one individual data item from among the incoming data items is selected, from among the plural compression algorithms, by the hardware processor, depending at least on said individual data item,
wherein the computer memory is to store the plural compression algorithms in association with respective plural data-item classes, and wherein a machine learning model is used to select the picked compression algorithm from among the plural compression algorithms by using the hardware processor, for at least one individual data item from among the incoming data items, to classify said individual data item as belonging to a class C from among the plural data-item classes and to select a compression algorithm associated with class C in said computer memory, as the picked compression algorithm for said individual data item.

18. The system according to claim 17 wherein at least the processor is deployed in a communication system including at least one transmitter and at least one receiver, thereby to define a transmitter side of the system and a receiver side of the system.

19. The system according to claim 18 wherein the processor uses a trained model to select the picked compression algorithm and wherein the trained model is deployed only in the transmitter and not in the receiver.

20. The system according to claim 18 wherein the transmitter side of the system is implemented by a GPU.

21. The system according to claim 17 wherein the processor uses a trained model to select the picked compression algorithm and wherein the model is accelerated using a GPU.

22. The system according to claim 21 wherein the model comprises a deep neural network which is offloaded to the GPU.

23. The system according to claim 17 wherein for each individual data item from among the incoming data items, the processor classifies said individual data item as belonging to a class C from among the plural data-item classes.

24. A data compression system comprising:
a computer memory to store plural compression algorithms; and
a hardware processor to apply at least one picked compression algorithm to incoming data items, wherein the picked compression algorithm to be applied to at least one individual data item from among the incoming data items is selected, from among the plural compression algorithms, by the hardware processor, depending at least on said individual data item, wherein the processor is configured in software to select and apply the picked compression algorithm to incoming data items and wherein the plural compression algorithms are offloaded to hardware, and wherein the plural compression algorithms are offloaded to a GPU, and wherein the processor is deployed in a data center networking management platform with network telemetry functionality and wherein said incoming data items store network telemetry data.

25. A data compression method comprising using a hardware processor for:

predicting a best compression algorithm for each of plural incoming data items, thereby to define plural best compression algorithms for said plural items respectively;

performing at least one of the following operations, A and B:

Operation A: for each data item A from among the plural items, which is to be compressed, retrieving compression code corresponding to a best algorithm A defined for item A by said predicting, and compressing said item A by running said compression code on said item A; and/or Operation B: for each data item B from among the plural items, which is compressed, retrieving decompression code corresponding to the best algorithm B defined for item B by said predicting, and decompressing said item B by running said decompression code on said item B; and using a hardware processor for performing, offline, the following:

creating a dataset with plural data entries, each including a data item paired with an indication of a best compression algorithm for that data item;

training a model to predict a best compression algorithm for each incoming data item, using said dataset as training data, thereby to provide a trained model; and deploying said trained model.

26. The method according to claim 25 and wherein said predicting occurs in real time or near-real time.

27. The method according to claim 25 wherein said trained model comprises a classifier.

28. The method according to claim 25 and wherein said trained model is deployed in a transmitter.

* * * * *